United States Patent [19]

Du et al.

[11] Patent Number: 5,502,680

[45] Date of Patent: Mar. 26, 1996

[54] SENSE AMPLIFIER WITH PULL-UP CIRCUIT FOR ACCELERATED LATCHING OF LOGIC LEVEL OUTPUT DATA

[76] Inventors: He Du, 1182 W. Hamilton Ave., Campbell, Calif. 95008; Yun-Ti Wang, 4299 Nerissa Cir., Fremont, Calif. 94555

[21] Appl. No.: 389,293

[22] Filed: Feb. 16, 1995

[51] Int. Cl.$^6$ .................................................. G11C 11/40
[52] U.S. Cl. ......................... 365/205; 365/204; 365/207
[58] Field of Search .................................. 365/205, 207, 365/208, 189.11, 204

[56] References Cited

U.S. PATENT DOCUMENTS

| | | | |
|---|---|---|---|
| 4,751,681 | 6/1988 | Hashimoto | 365/207 |
| 4,831,287 | 5/1989 | Golab | 365/207 |

OTHER PUBLICATIONS

Seno et al., "A 9-ns 16-Mb CMOS SRAM with Offset-Compensated Current Sense Amplifier," *IEEE Journal of Solid-State Circuits*, vol. 28, No. 11, (Nov. 1993) pp. 1119-1124.

Lee et al., "A 2.5 V CMOS Delay-Locked Loop for an 18 Mbit, 500 Mega-byte/s DRAM," *IEEE Journal of Solid-State Circuits*, vol. 29, No. 12, (Dec. 1994) pp. 1491-1496.

Sasaki et al., "A 7-ns 140-m 1-Mb CMOS SRAM with Current Sense Amplifier," *IEEE Journal of Solid-State Circuits*, vol. 27, No. 11, (Nov. 1992) pp. 1511-1518.

Ishibashi et al., "A 12.5-ns 16-Mb CMOS SRAM with Common-Centroid-Geometry-Layout Sense Amplifiers," *IEEE Journal of Solid-State Circuits*, vol. 29, No. 4 (Apr. 1994) pp. 411-418.

Yamauchi et al., "A Circuit Technology for High-Speed Battery-Operated 16-Mb CMOS DRAM's," *IEEE Journal of Solid-State Circuits*, vol. 28, No. 11, (Nov. 1993) pp. 1084-1091.

Sekiyama et al., "A 1-V Operating 256-kb Full-CMOS SRAM," *IEEE Journal of Solid-State Circuits*, vol. 27, No. 5 (May 1992) pp. 776-782.

Blalock et al., "A High-Speed Sensing Scheme for 1T Dynamic RAM's Utilizing the Clamped Bit-Line Sense Amplifier," *IEEE Journal of Solid-State Circuits*, vol. 27, No. 4 (Apr. 1992) pp. 618-625.

Aoki et al., "A 1.5-V DRAM for Battery-Based Applications," *IEEE Journal of Solid-State Circuits*, vol. 24, No. 5 (Oct. 1989) pp. 1206-1212.

Yoo et al., "Variable $V_{cc}$ Design Techniques for Battery-Operated DRAM's," *IEEE Journal of Solid-State Circuit*, vo. 28, No. 4 (Apr. 1993) pp. 499-503.

Seki et al., "A 6-ns 1-Mb CMOS SRAM with Latched Sense Amplifier," *IEEE Journal of Solid-State Circuits*, vol. 28, No. 4 (Apr. 1993) pp. 478-483.

*Primary Examiner*—David C. Nelms
*Assistant Examiner*—Vũ A. Lê

[57] ABSTRACT

A sense amplifier circuit includes a differential input circuit which receives first and second data inputs, din1 and din2, and generates, in response to a first control signal $\Phi_1$ being active LOW, a differential voltage across first and second nodes, which is indicative of a voltage difference between the first and second data inputs, din1 and din2; a pull-up circuit which connects, in response to a second control signal $\Phi_2$ being active LOW, a high voltage reference Vdd to both the first and second nodes; a latching circuit which generates and latches, in response to voltages provided on the first and second nodes by the differential input and pull-up circuits, first and second latched data outputs; and an equalization circuit which equalizes, in response to a third control signal $\Phi_0$ being active LOW, voltages on data lines respectively connected to the first and second data outputs. Timing of the first and second control signals, $\Phi_1$ and $\Phi_2$, is such that the second control signal $\Phi_2$ is activated LOW after a finite period following the initial activation of the first control signal $\Phi_1$. The third control signal $\Phi_0$ is preferably activated LOW when the first and second control signals, $\Phi_1$ and $\Phi_2$, are inactive HIGH.

16 Claims, 3 Drawing Sheets

SENSE AMPLIFIER WITH PULL-UP CIRCUIT FOR ACCELERATED LATCHING OF LOGIC LEVEL OUTPUT DATA

BACKGROUND OF THE INVENTION

This invention relates in general to sense amplifier circuits and in particular, to a sense amplifier circuit including a latch, and a pull-up circuit for accelerated latching of logic level output data.

Figure 1:
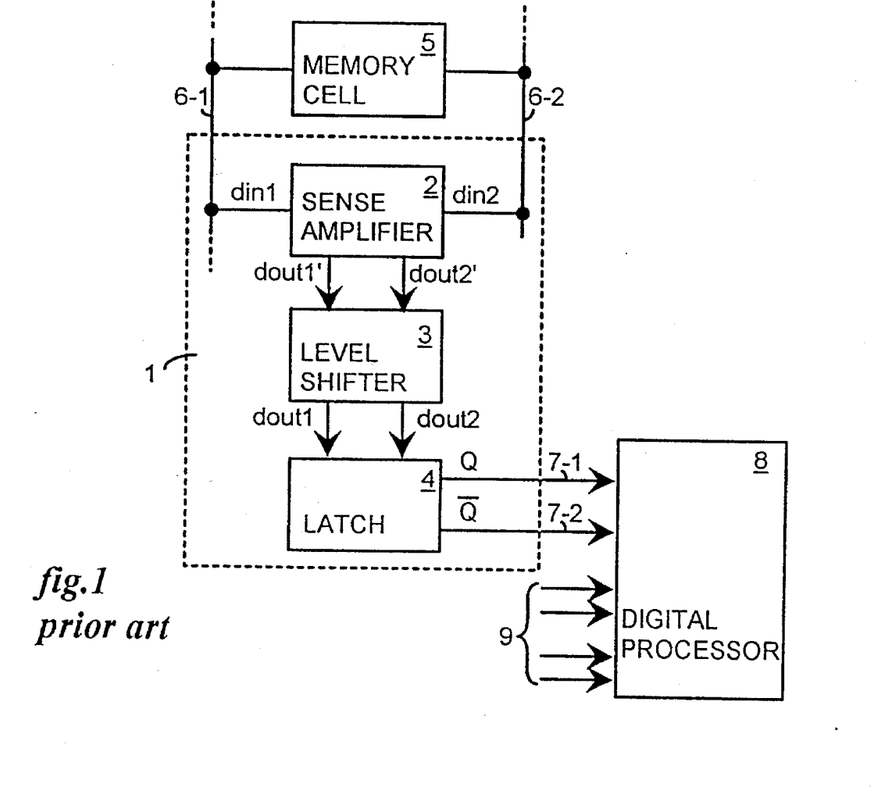
FIG. 1 illustrates, as an example, a block diagram of a circuit including a prior art sense amplifier circuit.

FIG. 1 illustrates, as an example, a block diagram of a prior art circuit 1 which includes a conventional sense amplifier circuit 2 for sensing a voltage differential between two input signals, din1 and din2, and generating two output signals, dout1' and dout2', indicative of the sensed voltage differential. The sense amplifier circuit 2, being an analog circuit, typically does not generate its two output voltages, dout1' and dout2', at conventional logic level voltages, e.g., 5 volts (representing a logic level HIGH) and 0volts (representing a logic level LOW). Accordingly, the prior art circuit 1 also includes a conventional level shifting circuit 3 which receives the outputs, dout1' and dout2', of the sense amplifier circuit 2, and converts or amplifies their respective signals such that corresponding outputs, dout1 and dout2, of the level shifting circuit 3 not only are indicative of the voltage differential sensed by the sense amplifier circuit 2, but also are generated at appropriate logic level voltages for digital processing purposes. Finally, the prior art circuit 1 also includes a latch 4 for latching the outputs, dout1 and dout2, of the level shifting circuit 3.

OBJECTS AND SUMMARY OF THE INVENTION

Generally desirable design goals include, when designing a circuit, maximizing the performance or speed of the circuit, and minimizing the size and power consumption of the circuit.

Accordingly, one object of the present invention is a sense amplifier circuit including level shifting and latching functions, which provides latched output data faster than prior art circuits.

Another object of the present invention is a sense amplifier circuit including level shifting and latching functions, which consumes less dc current and consequently, less power than prior art circuits.

Still another object of the present invention is a sense amplifier circuit including level shifting and latching functions, which operates faster and consumes less power than prior art circuits, and minimizes the size and complexity of the circuit for providing such benefits.

These and additional objects are accomplished by the various aspects of the present invention, wherein briefly stated, one aspect of the present invention is a sense amplifier circuit providing a latched logic level output indicative of a differential voltage between first and second signal lines, comprising: first means connected to the first and second signal lines, for generating, in response to a first control signal being activated, a differential voltage across first and second nodes indicative of the differential voltage between the first and second signal lines; second means connected to the first and second nodes, for connecting, in response to a second control signal being activated after the first control signal has initially been activated, a first reference voltage to the first and second nodes, causing the first means to cease generating the differential voltage across the first and second nodes; and third means connected to the first and second nodes, for providing the latched logic level output such that a logic state of the latched logic level output is determined by the differential voltage generated by the first means, and a voltage level of the latched logic level output is determined by the first reference voltage connected to the first and second nodes by the second means.

Another aspect of the invention is a sense amplifier for sensing the programmed state of a memory cell, comprising: a first transistor having a source, a drain, and a gate connected to a first data line associated with the memory cell; a second transistor having a source, a drain, and a gate connected to a second data line associated with the memory cell; first switching means for connecting, in response to a first control signal being activated, a first reference voltage to the drains of the first and second transistors; second switching means for connecting, in response to a second control signal being activated after the first control signal has been initially activated, the first reference voltage to the sources of the first and second transistors; a first inverter having an input, an output, and a first power input connected to the source of the first transistor; and a second inverter having an input connected to the output of the first inverter, an output connected to the input of the first inverter, and a second power input connected to the source of the second transistor, such that the first and second inverters form a data latch latching a logic level output indicative of the programmed state of the memory cell when the second control signal is activated.

Still another aspect of the present invention is a method of generating a latched data output indicative of a voltage difference between a first and a second data line, comprising: forming a data latch by connecting an output of a first inverter to an input of a second inverter, and an input of the first inverter to an output of the second inverter, wherein the first inverter is formed by connecting the gates of a first p-mos transistor and a first n-mos transistor together to form an input of the first inverter and connecting the drains of the first p-mos transistor and the first n-mos transistor together to form an output of the first inverter, and the source of the first p-mos transistor serves as a reference voltage input of the first inverter, and the second inverter is formed by connecting the gates of a second p-mos transistor and a second n-mos transistor together to form an input of the second inverter, and connecting the drains of the second p-mos transistor and the second n-mos transistor together to form an output of the second inverter, and the source of the second p-mos transistor serves as a reference voltage input of the second inverter; connecting, in response to a first control signal being active, a first voltage corresponding to the first data line to the reference voltage input of the first inverter, and a second voltage corresponding to the second data line to the reference voltage input of the second inverter; and generating, at the outputs of the first and second inverters, the latched data output indicative of the voltage difference between the first and second data lines, by connecting, in response to a second control signal being active after the first control signal has been initially active, a reference voltage to the reference voltage inputs of the first and second inverters such that a logic state of the latched data output is determined by a difference of the first and second voltages respectively corresponding to the first and second data lines, and a voltage level of the latched data output is determined by the reference voltage.

Additional objects, features and advantages the various aspects of the present invention will be apparent from the following description of its preferred embodiments, which

DETAILED DESCRIPTION OF THE PREFERRED EMBODIMENT

Sense amplifier circuits are useful in a number of circuit applications. For example, they are useful in memory reading circuitry for reading the programmed states of memory cells by sensing voltage differences between bit line pairs connected to individual memory cells. As another example, they are useful in comparator circuitry for comparing a voltage on a data line to another voltage by sensing the voltage difference between two voltages.

Figure 2:
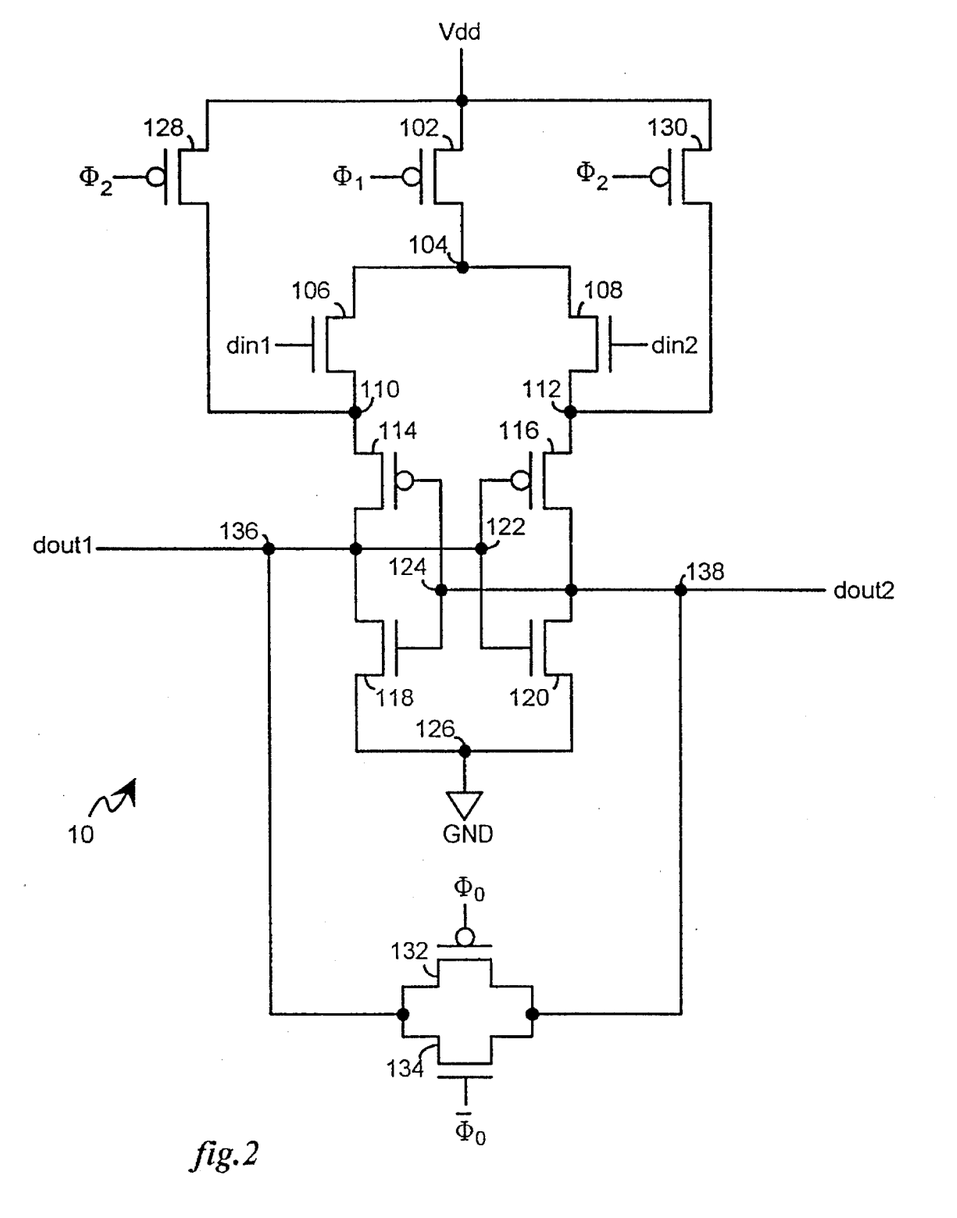
FIG. 2 illustrates, as an example, a sense amplifier circuit utilizing aspects of the present invention.

FIG. 2 illustrates a sense amplifier circuit 10 receiving first and second data inputs, din1 and din2, and generating, in response to control signals, $\Phi_0$, $\Phi_1$, and $\Phi_2$, first and second latched data outputs, dout1 and dout2, having logic states determined by a differential voltage between the first and second data inputs, din1 and din2, and voltage levels determined by high and low reference voltages, Vdd and GND. The first and second data inputs, din1 and din2, are typically respectively received via first and second data lines (e.g., 6-1 and 6-2 in FIG. 1) from an analog circuit, such as, for example, a memory cell (e.g., 5 in FIG. 1); and the first and second latched data outputs, dout1 and dout2, are typically respectively provided via first and second output data lines (e.g., 7-1 and 7-2 in FIG. 1) to a digital circuit, such as, for example, a microprocessor (e.g., 8 in FIG. 1).

A first stage or differential input circuit, including a p-mos FET 102, a n-mos FET 106, and a n-mos FET 108, receives the first and second data inputs, din1 and din2, and generates, in response to a first control signal $\Phi_1$ being active LOW, a differential voltage across first and second nodes, 110 and 112, which is indicative of a voltage difference between the first and second data inputs, din1 and din2. The p-mos FET 102 has a gate connected to the first control signal $\Phi_1$, a source connected to the high reference voltage Vdd, and a drain connected, at node 104, to the connected together drains of the n-mos FETs 106 and 108. The n-mos FET 106 has a gate connected to the first data input din1, a drain connected to the drain of p-mos FET 102, and a source connected to node 110. The n-mos FET 108 has a gate connected to the second data input din2, a drain connected to the drain of p-mos FET 102, and a source connected to node 112.

While the first control signal $\Phi_1$ is inactive HIGH, the p-mos FET 102 is turned off, allowing a node 104 to float. When the first control signal $\Phi_1$ becomes active LOW, however, the p-mos FET 102 turns on, connecting the high reference voltage Vdd to the connected together drains of the n-mos FETs 106 and 108. Thereupon, with the n-mos FETs 106 and 108 turning on, the voltage at the source of the n-mos FET 106 (i.e., at the first node 110) becomes equal to the voltage at the gate of the n-mos FET 106 less the threshold voltage of the n-mos FET 106, and the voltage at the source of the n-mos FET 108 (i.e., at the second node 112) becomes equal to the voltage at the gate of the n-mos FET 108 less the threshold voltage of the n-mos FET 108. Since the threshold voltages of the n-mos FETs 106 and 108 are preferably equal (i.e., the transistors are matched), the voltage difference generated by the first stage across the first and second nodes, 110 and 112, is substantially equal to the voltage difference between the first and second data inputs, din1 and din2.

A second stage or pull-up circuit, including p-mos FETs 128 and 130, connects, in response to a second control signal $\Phi_2$ being active LOW, the high voltage reference Vdd to both the first and second nodes, 110 and 112. In particular, the sources of p-mos FETs 128 and 130 are connected to the high voltage reference vdd, the gates of p-mos FETs 128 and 130 are connected to the second control signal $\Phi_2$, and the drain of p-mos FET 128 is connected to node 110 and the drain of p-mos FET 130 is connected to node 112. Timing of the second control signal $\Phi_2$ is such that it is preferably activated LOW after a finite period (i.e., time delay) following the initial activation of the first control signal $\Phi_1$. Duration of the finite period is preferably selected during circuit design simulation such that false latching of output data is avoided by the sense amplifier circuit 10.

A third stage or latching circuit, including p-mos FETs 114 and 116 and n-mos FETs 118 and 120, generates and latches, in response to voltages provided on the first and second nodes, 110 and 112, by the first and second stages, the first and second latched data outputs, dout1 and dout2. The latching circuit is preferably formed of first and second cross-coupled inverters, wherein an output of the first inverter is connected to an input of the second inverter, and an output of the second inverter is connected to an input of the first inverter. The first inverter comprises a p-mos FET 114 and a n-mos FET 118, wherein the source of the p-mos FET 114 is connected to the first node 110, the source of the n-mos FET 118 is connected to the low reference voltage GND, the gates of the p-mos FET 114 and the n-mos FET 118 are connected together to form the input of the first inverter, and the drains of the p-mos FET 114 and the n-mos FET 118 are connected together to form the output of the first inverter. The second inverter comprises a p-mos FET 116 and a n-mos FET 120, wherein the source of the p-mos FET 116 is connected to the second node 112, the source of the n-mos FET 120 is connected to the low reference voltage GND, the gates of the p-mos FET 116 and the n-mos FET 120 are connected together to form the input of the second inverter, and the drains of the p-mos FET 116 and the n-mos FET 120 are connected together to form the output of the second inverter.

An equalizing circuit, including a p-mos FET 132 and a n-mos FET 134, equalizes, in response to a third control signal $\Phi_0$ being active LOW, voltages on data lines (not shown) respectively connected at nodes 136 and 138 to the first and second data outputs, dout1 and dout2. In particular, the p-mos FET 132 and the n-mos 134 form a transmission gate which shorts (i.e., connects) nodes 136 and 138 together when the third control signal $\Phi_0$ is active LOW, and isolates (i.e., disconnects) nodes 136 and 138 from each other when the third control signal $\Phi_0$ is inactive HIGH. Timing of the third control signal $\Phi_0$ is such that it is preferably activated LOW when the first and second control signals, $\Phi_1$ and $\Phi_2$, are inactive HIGH, in order to save energy. Preferably, the third control signal $\Phi_0$ is generated at the output of an inverter (not shown) having the first control signal $\Phi_1$ connected to its input, so that the third control signal $\Phi_0$ is an inverted version of the first control signal $\Phi_1$.

Figure 3:
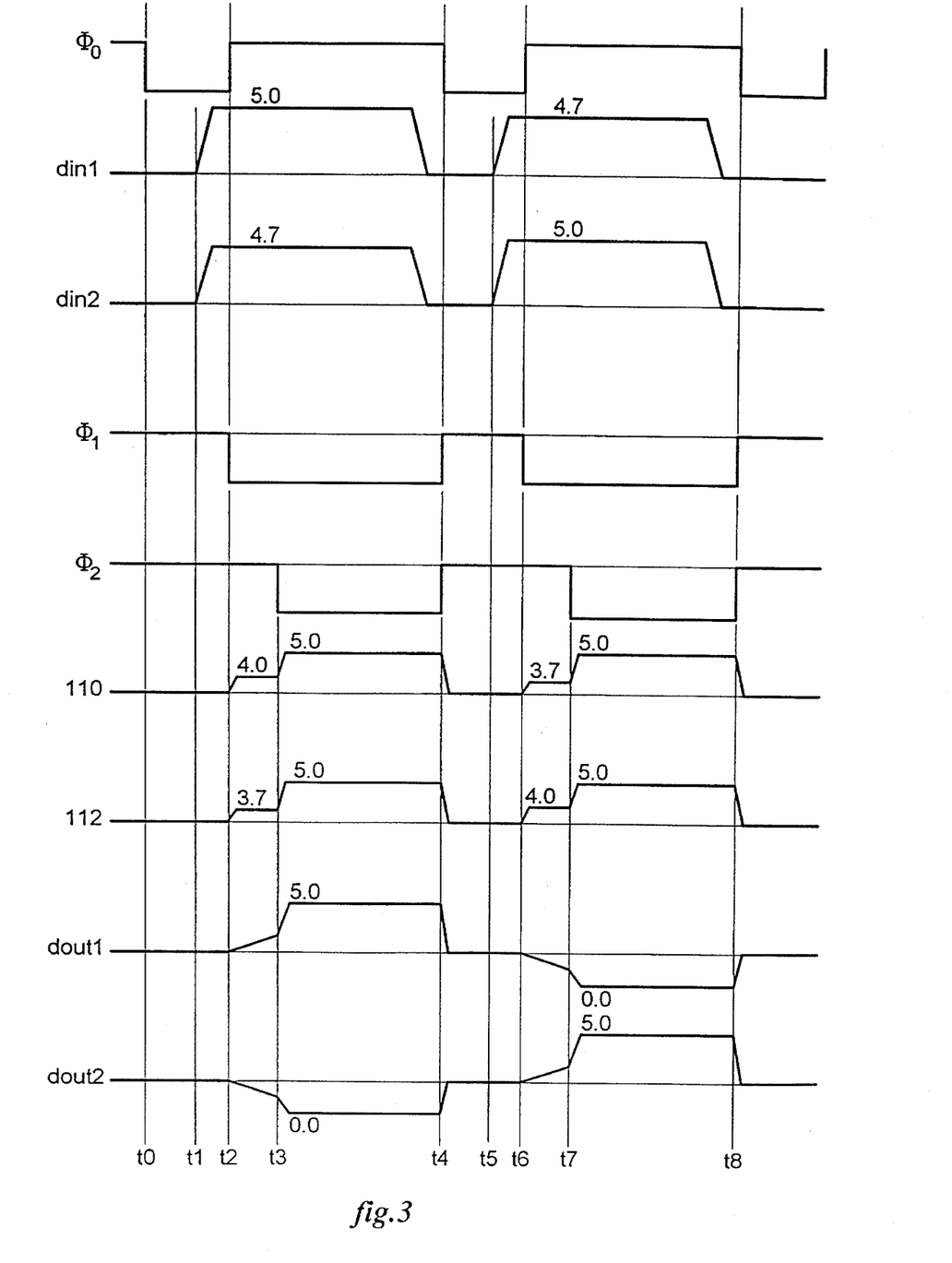
FIG. 3 illustrates, as examples, timing diagrams of certain inputs, outputs, and selected nodes of the sense amplifier circuit of FIG. 2, utilizing aspects of the present invention.

FIG. 3 illustrates timing diagrams useful for describing the operation of the sense amplifier circuit 10. Between time t0 and t2, the sense amplifier circuit 10 operates in an equalization mode, wherein it equalizes the voltages on the first and second data lines (not shown), which are respectively connected to the first and second data outputs, dout1 and dout2. During this mode, the third control signal $\Phi_0$ is active LOW, and the first and second control signals, $\Phi_1$ and $\Phi_2$, are preferably inactive HIGH. By making the first and second control signals, $\Phi_1$ and $\Phi_2$, inactive HIGH, the p-mos FETs 102, 128, and 130 are turned off, effectively disconnecting the high reference voltage vdd from the circuit. This minimizes the flow of dc current in the circuit and consequently, minimizes the power consumed by the circuit. Meanwhile, by making the third control signal $\Phi_0$ active LOW, both p-mos FET 132 and n-mos FET 134 turn on, effectively connecting the first and second data lines (not shown) together at nodes 136 and 138. This causes the voltage at node 136 (connected to the first data line) to become equal to the voltage at node 138 (connected to the second data line).

At time t1, input voltages are provided on the first and second data inputs, din1 and din2. The difference between the voltages provided on the first and second data inputs, din1 and din2, determines the logic state of the output data latched by the sense amplifier circuit 10. For example, if the voltage provided on the first data input din1 is 5.0 volts and the voltage provided on the second data input din2 is 4.7 volts (i.e., a differential voltage of 0.3 volts), then the first latched data output dout1 is preferably in a HIGH logic state and the second latched data output dout2 is preferably in a LOW logic state; and conversely, if the voltage provided on the first data input din1 is 4.7 volts and the voltage provided on the second data input din2 is 5.0 volts (i.e., a differential voltage of −0.3 volts), then the first latched data output dout1 is preferably in a LOW logic state and the second latched data output dout2 is preferably in a HIGH logic state.

Between time t2 and t3, the sense amplifier circuit 10 operates in an evaluation mode, wherein it generates a differential voltage across the first and second nodes, 110 and 112, which is indicative of the voltage difference between the first and second data inputs, din1 and din2. At time t2, the third control signal $\Phi_0$ becomes inactive HIGH, which turns off the p-mos FET 132 and the n-mos FET 134, disconnecting node 136 from 138. Also at or shortly after time t2, the first control signal $\Phi_1$ goes active LOW, turning on the p-mos FET 102. Consequently, the n-mos FETs 106 and 108 turn on, and a differential voltage across their sources (i.e., across the first and second nodes, 110 and 112) follows a differential voltage applied across their gates (i.e., across the first and second data inputs, din1 and din2). In particular, if the voltage on the gate of the n-mos FET 106 is 5.0 volts and the threshold voltage of the n-mos FET 106 is 1.0 volts, then the voltage on the source of the n-mos FET 106 (and the first node 110) becomes 4.0 volts (i.e., $V_{source} = V_{gate} - V_{threshold}$). Similarly, if the voltage on the gate of the n-mos FET 108 is 4.7 volts and the threshold voltage of the n-mos FET 108 is 1.0 volts, then the voltage on the source of the n-mos FET 108 (and the second node 112) becomes 3.7 volts (i.e., $V_{source} = V_{gate} - V_{threshold}$). In addition, due to the differential voltage being applied to the power inputs (i.e., first and second nodes, 110 and 112) respectively of the first and second inverters comprising the latching circuit of the sense amplifier circuit 10, a corresponding differential voltage tends to develop across the respective outputs, dout1 and dout2, of the cross-coupled inverters. Continuing with the above example, if the voltage on the first node 110 becomes 4.7 volts and the voltage on the second node 112 becomes 3.7 volts, then the first inverter will effectively overpower the second inverter (assuming they are equally sized) so that the first output dout1 will tend to rise to a HIGH logic state having a logic voltage limited by the voltage applied at the first node 110, from the source of the n-mos FET 106, less the voltage drop across the p-mos FET 114, and the second output dout2 will be accordingly forced to a LOW state having a logic voltage determined by the low reference voltage GND. Conversely, if the voltage on the second node 112 becomes 4.7 volts and the voltage on the first node 110 becomes 3.7 volts, then the second inverter will effectively overpower the first inverter (assuming they are equally sized) so that the second output dout2 will tend to rise to a HIGH logic state having a logic voltage limited by the voltage applied at node 112, from the source of the n-mos FET 108, less the voltage drop across the p-mos FET 116, and the first output dout1 will be accordingly forced to a LOW state having a logic voltage determined by the low reference voltage GND.

Between time t3 and t4, the sense amplifier circuit 10 operates in a data latching mode, wherein it accelerates the rate at which the output (dout1 or dout2) rising to a HIGH logic state rises, increases the voltage level to which the output (dout1 or dout2) rising to a HIGH logic state rises to, generates the latched data output by latching the output (dout1 or dout2) rising to a HIGH logic state to the HIGH logic state at the increased voltage level and the output (dout2 or dout1) being forced to a LOW logic state to the LOW logic state at a voltage level substantially equal to the low reference voltage GND, and minimizes the dc current flowing through the circuit to minimize the power being consumed by the circuit during the latching mode.

At time t3, the second control signal $\Phi_2$ is activated LOW, causing the p-mos FET 128 to turn on and consequently, the high voltage reference Vdd to be connected to the first node 110, and the p-mos FET 130 to turn on and consequently, the high reference voltage Vdd to be connected to the second node 112. The power input (i.e., the first node 110) of the first inverter, comprising the p-mos FET 114 and the n-mos FET 118, is pulled up to the high reference voltage vdd, the power input (i.e., the second node 112) of the second inverter, comprising the p-mos FET 116 and the n-mos FET 120, is also pulled up to the high reference voltage Vdd, and the n-mos FETs 106 and 108 are generally turned off. As a result, the output of the inverter (dout1 or dout2) rising to a HIGH logic state, rises towards the high reference voltage Vdd, instead of the voltage at the source of its corresponding n-mos transistor (106 or 108 in FIG. 2) of the differential input circuit of the sense amplifier circuit 10, and rises at a faster rate than it did during the evaluation mode, because of the additional current being provided through the p-mos FETs 128 and 130.

Additionally, the dc current flowing through the sense amplifier circuit 10 is minimized during the data latching mode in order to minimize power consumption of the circuit. In particular, during the data latching mode, generally no dc current flows through either the differential input circuit, including the p-mos FET 102 and the n-mos FETs 106 and 108, of the sense amplifier circuit 10, or the latching circuit, including the p-mos FETs 114 and 116 and the n-mos FETs 118 and 120, of the sense amplifier circuit 10. No dc current flows through the differential input circuit, because the n-mos FETs 106 and 108 are generally turned off. The n-mos FETs 106 and 108 are turned off, for example, if the high reference voltage Vdd is 5.0 volts, the voltages on the gates of the n-mos FETs 106 and 108 are respectively 5.0 and 4.7 volts, and the respective threshold voltages of the n-mos FETs 106 and 108 are both 1.0 volts. In this example, both the n-mos FETs 106 and 108 will be turned off since their gate voltages do not exceed their source voltages by more than their threshold voltages. No dc current flows through the latching circuit, because no dc current flows through the series connected p-mos and n-mos FETs comprising each of the first and second inverters. For example, if the p-mos FET 114 is turned on, then the n-mos FET 118 is turned off, and no dc current flows through the first inverter, comprising the p-mos FET 114 and the n-mos FET 118. Conversely, if the p-mos FET 114 is turned off, then the n-mos FET 118 is turned on, and again, no dc current flows through the first inverter. A similar example can be constructed for the second inverter, comprising the p-mos FET 116 and the n-mos FET 120, of the latching circuit of the sense amplifier circuit 10.

During time t4 to t8, the above described operation of the sense amplifier circuit 10 is repeated with the difference that the voltages applied to the first and second data inputs, din1 and din2, to the sense amplifier circuit 10, are reversed. As shown in FIG. 3, by reversing the voltages applied to the first and second data inputs, din1 and din2, the latched data output, dout1 and dout2, reverses. In particular, as depicted in the first cycle represented by the time period t0 to t4, the first latched data output dout1 is latched to a HIGH logic state (e.g., logic level voltage of 5.0 volts) and the second latched-data output dout2 is latched to a LOW logic state (e.g., logic level voltage of 0.0 volts) when voltages of 5.0 and 4.7 volts are respectively applied, for example, to the first and second data inputs, din1 and din2, and as depicted in the second cycle represented by the time period t4 to t8, the first latched data output dout1 is latched to a LOW logic state and the second latched data output dout 2 is latched to a HIGH logic state when the reversed voltages of 4.7 and 5.0 volts are respectively applied to the first and second data inputs, din1 and din2.

Figure 4:
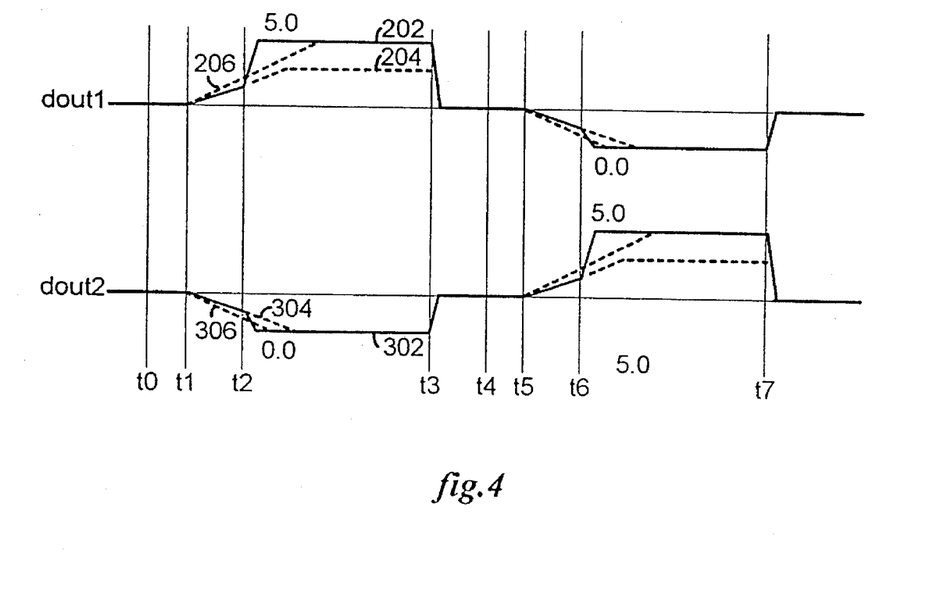
FIG. 4 illustrates, as examples, timing diagrams of outputs of sense amplifier circuits with and without circuitry utilizing aspects of the present invention.

FIG. 4 illustrates, for comparative purposes, latched signal responses, 206 and 306, corresponding to a prior art circuit such as depicted, for example, in FIG. 1, and latched signal responses, 202 and 302, corresponding to the sense amplifier circuit 10. In addition to drawing less dc current than the prior art circuit of FIG. 1, the sense amplifier circuit 10 also provides its latched signal responses, 202 and 302, faster than those of the prior art circuit of FIG. 1, because of the additional current supplied by the second stage or pull-up circuit, including p-mos FETs 128 and 130, of the sense amplifier circuit 10 when latching the output data. The signal response 204 depicts, as an example, a response of the sense amplifier circuit 10 to a differential input without the pull-up circuit, comprising p-mos FETs 128 and 130.

Although the various aspects of the present invention have been described with respect to a preferred embodiment, it will be understood that the invention is entitled to full protection within the full scope of the appended claims.

What is claimed is:

1. A sense amplifier circuit providing a latched logic level output indicative of a differential voltage between first and second signal lines, comprising:

first means connected to said first and second signal lines, for generating, in response to a first control signal being activated, a differential voltage across first and second nodes indicative of said differential voltage between said first and second signal lines, second means connected to said first and second nodes, for connecting, in response to a second control signal being activated after said first control signal has initially been activated, a first reference voltage to said first and second nodes, causing said first means to cease generating said differential voltage across said first and second nodes, and third means connected to said first and second nodes, for providing said latched logic level output such that a logic state of said latched logic level output is determined by said differential voltage generated by said first means, and a voltage level of said latched logic level output is determined by said first reference voltage connected to said first and second nodes by said second means.

2. The sense amplifier circuit as recited in claim 1, wherein said first means comprises:

a first transistor having a source connected to said first node, a drain, and a gate connected to said first signal line, a second transistor having a source connected to said second node, a drain, and a gate connected to said second signal line, and first switching means for connecting, in response to said first control signal being activated, said first reference voltage to said drains of said first and second transistors.

3. The sense amplifier circuit as recited in claim 1, wherein said second means comprises:

a first transistor having a source connected to said first reference voltage, a drain connected to said first node, and a gate connected to said second control signal, and a second transistor having a source connected to said first reference voltage, a drain connected to said second node, and a gate connected to said second control signal.

4. The sense amplifier circuit as recited in claim 1, wherein said third means comprises:

a first inverter powered by a voltage on said first node, and having an input and an output, and a second inverter powered by a voltage on said second node, and having an input and an output, wherein said input of said first inverter is connected to said output of said second inverter and said input of said second inverter is connected to said output of said first inverter such that said first and second inverters form a data latch latching said logic level output when said second control signal is activated.

5. The sense amplifier circuit as recited in claim 4, further comprising equalizing means responsive to a third control signal, and connected to said outputs of said first and second inverters, for equalizing respective voltages on said outputs of said first and second inverters when said third control signal is activated.

6. The sense amplifier circuit as recited in claim 5, wherein said third control signal is an inverted version of said first control signal.

7. The sense amplifier circuit as recited in claim 1, wherein said first means comprises:

a first p-mos transistor having a source connected to said first reference voltage, a gate connected to said first control signal, and a drain, a first n-mos transistor having a drain connected to said drain of said first p-mos transistor, a gate connected to said first signal line, and a source connected to said first node, and a second n-mos transistor having a drain connected to said drain of said first p-mos transistor, a gate connected to said second signal line, and a source connected to said second node.

8. The sense amplifier circuit as recited in claim 7, wherein said second means comprises:
a second p-mos transistor having a source connected to said first reference voltage, a gate connected to said second control signal, and a drain connected to said first node, and
a third p-mos transistor having a source connected to said first reference voltage, a gate connected to said second control signal, and a drain connected to said second node.

9. The sense amplifier circuit as recited in claim 8, wherein said third means comprises:
a first inverter including a fourth p-mos transistor having a source connected to said first node, a gate, and a drain, and a third n-mos transistor having a drain connected to said drain of said fourth p-mos transistor, a gate connected to said gate of said fourth p-mos transistor, and a source connected to a second reference voltage, wherein said connected gates of said fourth p-mos transistor and said third n-mos transistor form an input of said first inverter, and said connected drains of said fourth p-mos transistor and said third n-mos transistor form an output of said first inverter, and
a second inverter including a fifth p-mos transistor having a source connected to said second node, a gate, and a drain, and a fourth n-mos transistor having a drain connected to said drain of said fifth p-mos transistor, a gate connected to said gate of said fifth p-mos transistor, and a source connected to said second reference voltage, wherein said connected gates of said fifth p-mos transistor and said fourth n-mos transistor form an input of said second inverter, said connected drains of said fifth p-mos transistor and said fourth n-mos transistor form an output of said second inverter, and said output of said first inverter is connected to said input of said second inverter and said output of said second inverter is connected to said input of said first inverter such that said first and second inverters form a data latch latching said latched logic level output when said second control signal is activated.

10. The sense amplifier circuit as recited in claim 9, further comprising:
a fifth n-mos transistor having a drain connected to said output of said second inverter, a gate connected to a third control signal, and a source connected to said output of said first inverter, and
a sixth p-mos transistor having a source connected to said output of said second inverter, a gate connected to an inverted version of said third control signal, and a drain connected to said output of said first inverter such that a voltage on said output of said first inverter is equalized to a voltage on said output of said second inverter when said third control signal is in an active state.

11. A sense amplifier for sensing the programmed state of a memory cell, comprising:
a first transistor having a source, a drain, and a gate connected to a first data line associated with said memory cell,
a second transistor having a source, a drain, and a gate connected to a second data line associated with said memory cell,
first switching means for connecting, in response to a first control signal being activated, a first reference voltage to said drains of said first and second transistors,
second switching means for connecting, in response to a second control signal being activated after said first control signal has been initially activated, said first reference voltage to said sources of said first and second transistors,
a first inverter having an input, an output, and a first power input connected to said source of said first transistor, and
a second inverter having an input connected to said output of said first inverter, an output connected to said input of said first inverter, and a second power input connected to said source of said second transistor, such that said first and second inverters form a data latch latching a logic level output indicative of said programmed state of said memory cell when said second control signal is activated.

12. The sense amplifier circuit as recited in claim 11, further comprising equalizing means responsive to a third control signal activated before activating said first and second control signals, and connected to said outputs of said first and second inverters, for equalizing the respective voltages on said outputs of said first and second inverters when said third control signal is activated.

13. The sense amplifier circuit as recited in claim 12, wherein said third control signal is an inverted version of said first control signal.

14. A method of generating a latched data output indicative of a voltage difference between a first and a second data line, comprising:
forming a data latch by connecting an output of a first inverter to an input of a second inverter, and an input of said first inverter to an output of said second inverter, wherein said first inverter is formed by connecting the gates of a first p-mos transistor and a first n-mos transistor together to form an input of said first inverter and connecting the drains of said first p-mos transistor and said first n-mos transistor together to form an output of said first inverter, and the source of said first p-mos transistor serves as a reference voltage input of said first inverter, and said second inverter is formed by connecting the gates of a second p-mos transistor and a second n-mos transistor together to form an input of said second inverter, and connecting the drains of said second p-mos transistor and said second n-mos transistor together to form an output of said second inverter, and the source of said second p-mos transistor serves as a reference voltage input of said second inverter,
connecting, in response to a first control signal being active, a first voltage corresponding to said first data line to said reference voltage input of said first inverter, and a second voltage corresponding to said second data line to said reference voltage input of said second inverter, and
generating, at said outputs of said first and second inverters, said latched data output indicative of said voltage difference between said first and second data lines, by connecting, in response to a second control signal being active after said first control signal has been initially active, a reference voltage to said reference voltage inputs of said first and second inverters such that a logic state of said latched data output is determined by a difference of said first and second voltages respectively corresponding to said first and second data lines, and a voltage level of said latched data output is determined by said reference voltage.

15. The method as recited in claim 14, further comprising:

connecting said output of said first inverter to a first output data line and said output of said second inverter to a second output data line, and equalizing, in response to a third control signal being active, voltages respectively on said first and second output data lines.

16. The method as recited in claim 15, further comprising generating said third control signal by inverting said first control signal.

* * * * *

UNITED STATES PATENT AND TRADEMARK OFFICE
CERTIFICATE OF CORRECTION

PATENT NO. : 5,502,680
DATED : March 26, 1996
INVENTOR(S) : He Du

It is certified that error appears in the above-indentified patent and that said Letters Patent is hereby corrected as shown below:

On the title page, item [73], assignee add

Cirrus Logic, Inc., Fremont, Calif.

Add to title page, after Assistant Examiner, Attorney of Record:

Attorney, Agent, or Firm - Majestic, Parsons, Siebert & Hsue

Signed and Sealed this

Third Day of September, 1996

*Attest:*

BRUCE LEHMAN

*Attesting Officer*     *Commissioner of Patents and Trademarks*